United States Patent [19]

Imai

[11] Patent Number: 4,675,719
[45] Date of Patent: Jun. 23, 1987

[54] THYRISTOR DEVICE

[75] Inventor: Michio Imai, Hyogo, Japan

[73] Assignee: Mitsubishi Denki Kabushiki Kaisha, Tokyo, Japan

[21] Appl. No.: 764,550

[22] Filed: Aug. 12, 1985

[30] Foreign Application Priority Data

Oct. 15, 1984 [JP] Japan .................. 59-215652

[51] Int. Cl.<sup>4</sup> .............................. H01L 23/16
[52] U.S. Cl. ........................ 357/75; 357/74; 357/79
[58] Field of Search ................ 357/74, 75, 79

[56] References Cited

U.S. PATENT DOCUMENTS 4,245,232  1/1981  Bacuview ............................. 357/75

FOREIGN PATENT DOCUMENTS 55-114135  9/1980  Japan .
0159233    1/1979  Netherlands ......................... 357/75

Primary Examiner—James W. Davie
Assistant Examiner—Georgia Y. Epps
Attorney, Agent, or Firm—Bernard, Rothwell & Brown

[57] ABSTRACT

A thyristor device where the thyristor and protection device are formed flat with two surfaces thereof operating as a electrodes, and the conductive plate which electrically connects these electrodes is held between the thyristor and the protection device.

2 Claims, 2 Drawing Figures

THYRISTOR DEVICE

BACKGROUND OF THE INVENTION

1. Field of the Invention

The present invention relates to a thyristor device and particularly to a thyristor device providing a protection means which protects a thyristor from an external surge.

2. Description of the Prior Art

A device shown in FIG. 1 has been proposed as a thyristor device of this type. FIG. 1 is a block connection diagram indicating a thyristor device, in which numeral 1 denotes a thyristor, 2 is a protection element connected in parallel to the thyristor 1 through the connecting conductors 3, 4. Numeral 5 is an object to be controlled by the thyristor, and this control object 5 and thyristor 1 are connected through the connecting conductors 6, 7. The protection element 2 forms a so-called surge absorption circuit and is composed of an RC circuit and an avalanche diode as the non-linear element. Particularly, if a control object is an inductive load such as a motor, a flywheel diode, for example, is used as the protection element. Moreover, a lead or cable having a constant current capacity is used as the connecting conductors 3, 4, 6 and 7.

Operations of the device shown in FIG. 1 are explained. It is assumed that a surge or short-circuit of control object 5 is generated when a lightning surge occurs or the switch is opened or closed. In this case, a surge voltage reaches the thyristor 1 through the connecting conductors 6, 7 from the control object 5. Thereby, the protection element 2 absorbs such surge voltage in order to prevent breakdown of thyristor 1.

The thyristor device of the prior art providing a protection device is constituted as explained above and therefore there has arisen a problem that a surge current coming from the side of control object 5 flows into the connecting conductors 3, 4 such as lead wire and cable which connects the thyristor 1 and protection element 2 causing a risk of inductive interference on the electrical circuits near these connecting conductors 3, 4 and therefore the thyristor device has to be located apart from the electrical circuits in order to avoid such inductive interference. Moreover, this thyristor device has a disadvantage that the device as a whole including a thyristor 1, a protection element 2 and connecting conductors 3, 4, 6, and 7 occupies a large space.

SUMMARY OF THE INVENTION

The present invention has solved these disadvantages of the prior art and therefore it is an object of the present invention to provide a thyristor device which suppresses inductive interference by a surge current to an external circuit by reducing the conductors connecting the thyristor and protection element as much as possible to realize a reduction in the size of the device.

Other objects and features of the present invention will become apparent from the following detailed description taken in conjunction with the preferred embodiment thereof with reference to the accompanying drawings.

DETAILED DESCRIPTION OF THE PREFERRED EMBODIMENT

Figure 2:
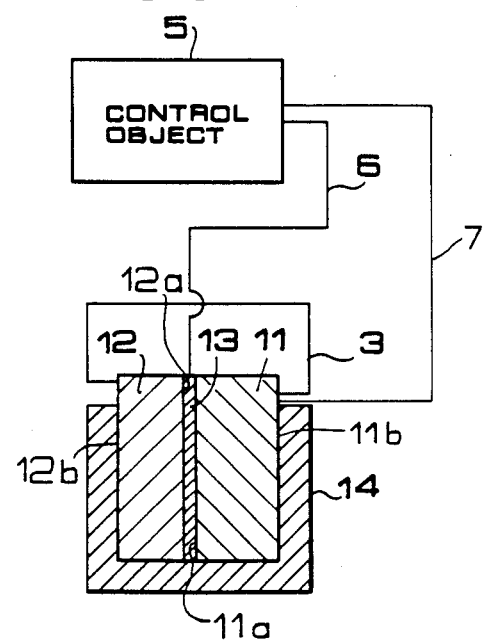
FIG. 2 is a block diagram indicating the thyristor device of the preferred embodiment of the present invention.

A preferred embodiment of the present invention is explained hereinafter. In FIG. 2, a reference numeral 11 is a flat type thyristor and two surfaces thereof form the electrodes 11a and 11b. 12 is a protection element of a flat type protection device and two surfaces thereof form electrodes these electrodes being designated by the numerals 12a and 12b in FIG. 2. A thin copper or aluminum conductive plate 13 is held between the one electrode 11a of the thyristor 11 and surface 12a of the protection element 12. 14 is a U-shaped pressurizing member which is placed in contact with the other electrode 11b of the thyristor 11 and protection element 12, holding them closely in contact with the conductive plate 13 and giving thereto good electrical conductivity. 3 is a similar connecting conductor connecting electrodes 11b and 12b and 6, 7 are also similar connecting conductors connecting the control object 5 to the thyristor 11.

Figure 1:
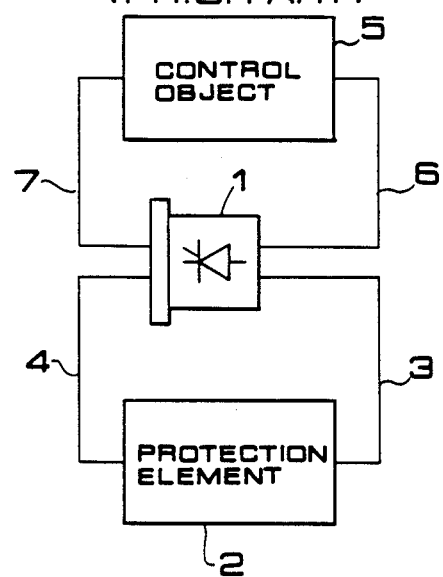
FIG. 1 is a block diagram indicating the thyristor device of the prior art.

Operations of the above-mentioned device are now explained. In such a thyristor device, if a surge voltage is supplied to the thyristor 11 from the side of control object 5, the protection element 12 absorbs such surge voltage through the conductive plate 13 in order to protect the thyristor 11. In addition, this conductive plate 13 may be formed as a thin conductive film. Therefore, the conductive plate 13 is an alternative of a long connecting conductor 4 shown in FIG. 1. However, it is very short in length and therefore it is not provided near the external circuits and does not have the function of an antenna. Accordingly, it does not result in inductive interference due to the switching surge, etc. on the external circuits. The embodiment also assures the advantages that the space occupied by the device can be reduced and the device itself can also be formed small in size by omission of connecting conductor 4 of the prior art.

In the above embodiment, an existing connecting conductor 4 is eliminated and the conductive plate 13 is used. Moreover, it is also possible that a further space-saving type small size thyristor device can be formed by eliminating the connecting conductor 3 and using the pressurizing material 14 itself as the conductive material.

In this invention, the conductive plate connects one electrode of thyristor and one electrode protection element with a very short distance between the electrodes. Therefore, the conductive plate is in contact with external circuits and thereby any inductive interference is not generated from this conductive plate to the external circuits. Since the electrodes are not connected with leads or cables, it is not required to provide extra space to the device and the thyristor device as a whole can be reduced in size.

What is claimed is:

1. A thyristor device comprising a thyristor and a protection element which limits a surge voltage appearing across the electrodes of said thyristor, said protection element being connected in parallel to said thyristor, said thyristor and said protection element being formed flat with two surfaces thereof forming electrodes; a conductive plate held between one electrode of said thyristor and one electrode of said protection element; and a pressurizing member of conductive material engaging the other electrode of said thyristor and the other electrode of said protection element for holding said thyristor, said conductive plate and said protection element in pressurized engagement.

2. A thyristor device comprising:
(a) a flat thyristor having two surfaces comprising a first electrode and a second electrode;
(b) a flat protection element disposed adjacent to said thyristor and having two surfaces comprising a first electrode and a second electrode;
(c) a flat conductive plate interposed between said first electrode of said thyristor and said first electrode of said protection element;
(d) a pressurizing member engaging said second electrode of said thyristor and said second electrode of said protection element and holding said thyristor and said protection element closely abutted against said conductive plate;
(e) a first connecting conductor connecting said second electrode of said thyristor to said second electrode of said protection element;
(f) a second connecting conductor connecting a control object controlled by said thyristor to said conductive plate; and
(g) a third connecting conductor connecting said control object to said second electrode of said thyristor.

* * * * *